United States Patent
Horstmann et al.

(10) Patent No.: US 8,188,871 B2
(45) Date of Patent: May 29, 2012

(54) DRIVE CURRENT ADJUSTMENT FOR TRANSISTORS BY LOCAL GATE ENGINEERING

(75) Inventors: Manfred Horstmann, Duerrroehrsdorf-Dittersbach (DE); Patrick Press, Dresden (DE); Karsten Wieczorek, Dresden (DE); Kerstin Ruttloff, Hainichen (DE)

(73) Assignee: Advanced Micro Devices, Inc., Austin, TX (US)

( * ) Notice: Subject to any disclaimer, the term of this patent is extended or adjusted under 35 U.S.C. 154(b) by 362 days.

(21) Appl. No.: 12/472,969

(22) Filed: May 27, 2009

(65) Prior Publication Data
US 2010/0025776 A1 Feb. 4, 2010

(30) Foreign Application Priority Data
Jul. 31, 2008 (DE) .................. 10 2008 035 813

(51) Int. Cl.
*G08B 17/00* (2006.01)

(52) U.S. Cl. ........ 340/584; 340/595; 340/599; 340/458; 340/568.1; 340/10.1; 340/10.5; 340/572.1; 340/572.4; 257/347; 257/369; 257/372; 257/412; 257/413; 257/655; 257/E21.09; 438/311; 438/455; 438/481; 438/694; 365/189.05; 365/189.07; 365/189.08

(58) Field of Classification Search .................. 340/584, 340/595, 599, 458, 568.1, 10.1, 10.5, 572.1, 340/572.4; 257/347, 369, 372, 412, 413, 257/655, E21.09; 438/311, 455, 481, 694; 365/189.05, 189.07, 189.08
See application file for complete search history.

(56) References Cited

U.S. PATENT DOCUMENTS

| | | | | |
|---|---|---|---|---|
| 5,616,948 | A | * | 4/1997 | Pfiester .......................... 257/412 |
| 5,930,620 | A | | 7/1999 | Wristers et al. ................ 438/243 |
| 6,261,885 | B1 | * | 7/2001 | Cheek et al. ................... 438/199 |
| 2004/0238897 | A1 | | 12/2004 | Oishi .............................. 257/369 |
| 2006/0097294 | A1 | | 5/2006 | Yamashita et al. ............. 257/288 |

OTHER PUBLICATIONS

Fenouillet-Beranger et al., "Fully-Depleted SOI Technology Using High-K and Single-Metal Gate for 32nm Node LSTP Applications Featuring 0.179µm² 6T-SRAM bitcell," 2007 IEEE.
Translation of Official Communication from German Patent Office for German Patent Application No. 10 2008 035 824.4-33 dated Mar. 26, 2009.

* cited by examiner

*Primary Examiner* — Tai T Nguyen
(74) *Attorney, Agent, or Firm* — Williams, Morgan & Amerson (57) ABSTRACT

In a memory cell, the drive current capabilities of the transistors may be adjusted by locally providing an increased gate dielectric thickness and/or gate length of one or more of the transistors of the memory cell. That is, the gate length and/or the gate dielectric thickness may vary along the transistor width direction, thereby providing an efficient mechanism for adjusting the effective drive current capability while at the same time allowing the usage of a simplified geometry of the active region, which may result in enhanced production yield due to enhanced process uniformity. In particular, the probability of creating short circuits caused by nickel silicide portions may be reduced.

26 Claims, 7 Drawing Sheets

DRIVE CURRENT ADJUSTMENT FOR TRANSISTORS BY LOCAL GATE ENGINEERING

BACKGROUND

1. Field of the Disclosure

Generally, the present disclosure relates to integrated circuits, and, more particularly, to the manufacture of field effect transistors in complex circuits including memory areas, for instance in the form of a cache memory of a CPU.

2. Description of the Related Art

Integrated circuits comprise a large number of circuit elements on a given chip area according to a specified circuit layout, wherein transistor elements represent one of the major semiconductor elements in the integrated circuits. Hence, the characteristics of the individual transistors significantly affect overall performance of the complete integrated circuit. Generally, a plurality of process technologies are currently practiced, wherein, for complex circuitry, such as microprocessors, storage chips, ASICs (application specific ICs) and the like, MOS technology is currently one of the most promising approaches due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect renders the reduction of the channel length, and associated therewith the reduction of the channel resistivity, a dominant design criterion for accomplishing an increase in the operating speed of the integrated circuits.

On the other hand, the drive current capability of MOS transistors also depends on the transistor width, i.e., the extension of the transistor in a direction perpendicular to the current flow direction, so that the gate length, and thus the channel length, in combination with the transistor width, are dominant geometric parameters which substantially determine the overall transistor characteristics, in combination with "transistor internal" parameters, such as overall charge carrier mobility, threshold voltage, i.e., a voltage at which a conductive channel forms below the gate insulation layer upon applying a control signal to the gate electrode, and the like. On the basis of field effect transistors, such as N-channel transistors and/or P-channel transistors, more complex circuit components may be created, depending on the overall circuit layout. For instance, storage elements in the form of registers, static RAM (random access memory), may represent important components of complex logic circuitries. For example, during the operation of complex CPU cores, a large amount of data has to be temporarily stored and retrieved, wherein the operating speed and the capacity of the storage elements have a significant influence on the overall performance of the CPU. Depending on the memory hierarchy used in a complex integrated circuit, different types of memory elements are used. For instance, registers and static RAM cells are typically used in the CPU core due to their superior access time, while dynamic RAM elements are preferably used as working memory due to the increased bit density compared to registers or static RAM cells. Typically, a dynamic RAM cell comprises a storage capacitor and a single transistor, wherein, however, a complex memory management system is required to periodically refresh the charge stored in the storage capacitors, which may otherwise be lost due to unavoidable leakage currents. Although the bit density of dynamic RAM devices may be very high, charge has to be transferred from and to the storage capacitors in combination with periodic refresh pulses, thereby rendering these devices less efficient in terms of speed and power consumption compared to static RAM cells. Thus, static RAM cells may be advantageously used as high speed memory with moderately high power consumption, thereby, however, requiring a plurality of transistor elements so as to allow the reliable storage of an information bit.

Figure 1A:
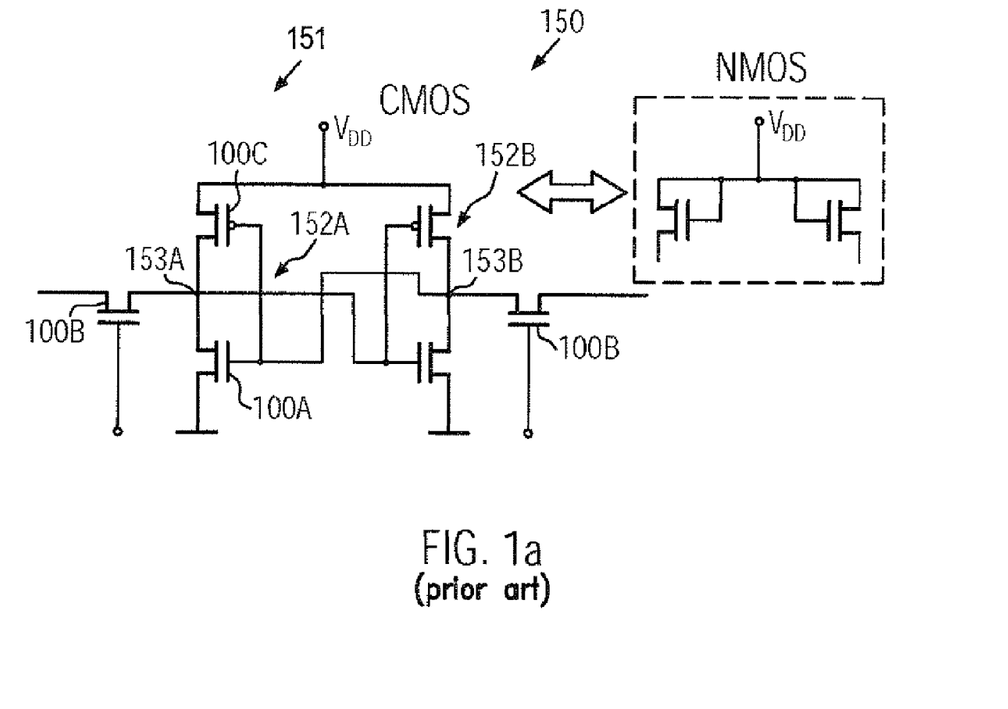
FIG. 1a schematically illustrates a circuit diagram of a conventional static RAM cell including two inverters and respective pass transistors.

FIG. 1a schematically illustrates a circuit diagram of a static RAM cell 150 in a configuration as may typically be used in modern integrated circuits. The cell 150 comprises a storage element 151, which may include two inversely coupled inverters 152A, 152B, each of which may include a couple of transistors 10A, 100C. For example, in a CMOS device, the transistors 100A, 100C may represent an N-channel transistor and a P-channel transistor, respectively, while in other cases transistors of the same conductivity type, such as N-channel transistors, may be used for both the transistor 100A and 100C. A corresponding arrangement of N-channel transistors for the upper transistors 100C is illustrated at the right-hand side of FIG. 1a. Moreover, respective pass transistors 100B may typically be provided to allow a connection to the bit cell 151 for read and write operations, during which the pass transistors 100B may connect the bit cell 151 to corresponding bit lines (not shown), while the gate electrodes of the pass transistors 100B may represent word lines of the memory cell 150. Thus, as illustrated in FIG. 1a, six transistors may be required to store one bit of information, thereby providing a reduced bit density for the benefit of a moderately high operating speed of the memory cell 150, as previously explained. Depending on the overall design strategy, the memory cell 150 may require the various transistor elements 100A, 100B, 100C to have different characteristics with respect to drive current capability in order to provide reliable operational behavior during read and write operations. For example, in many design strategies, the transistor elements are provided with minimum transistor length, wherein the drive current capability of the transistors 100A, which may also be referred to as pull-down transistors, may be selected to be significantly higher compared to the drive current capability of the pass transistors 100B, which may be accomplished by appropriately adjusting the respective transistor width dimensions for the given desired minimum transistor length.

Figure 1B:
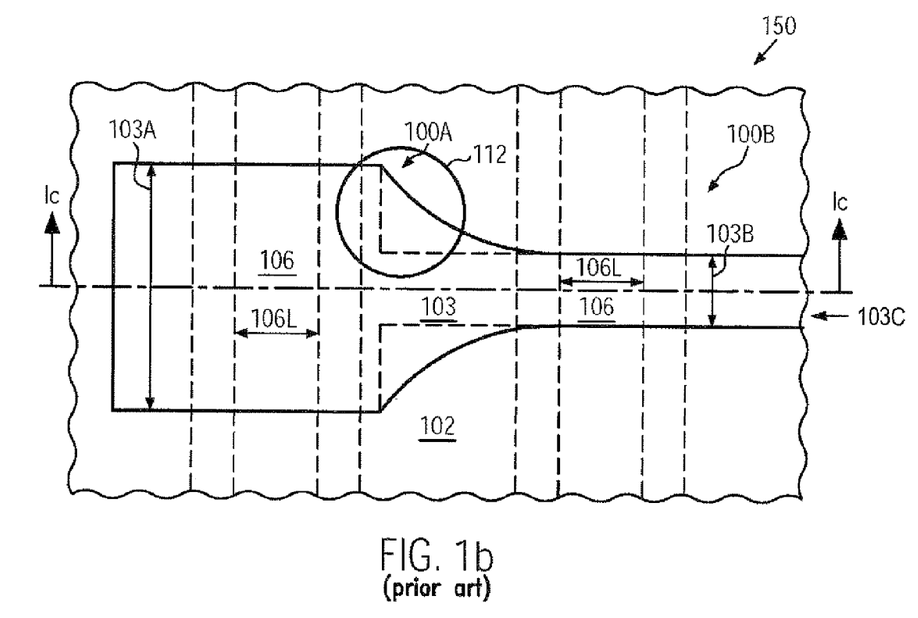
FIG. 1b schematically illustrates a top view of the memory cell of FIG. 1a, wherein a ratio of drive currents is adjusted by providing different widths of the pull down transistor and the pass transistor, according to conventional techniques.

FIG. 1b schematically illustrates a top view of a portion of the memory cell 150 as a hardware configuration in the form of a semiconductor device. As illustrated, the device 150 comprises a silicon-based semiconductor layer 103C, in which an active region 103 is defined, for instance, by providing a respective isolation structure 102 that laterally encloses the active region 103, thereby defining the geometric shape and size of the transistors 100A, 100B. As illustrated, the transistors 100A, 100B may be formed in and above the same active region 103 since both transistors may have the same conductivity type and may be connected via a common node, as is for instance illustrated as nodes 153A, 153B in FIG. 1a. As previously explained, the transistors 100A, 100B, i.e., the pull-down transistor and the pass transistor, may have substantially the same length so that respective gate electrodes 106 may have substantially the same length 106L, whereas a transistor width 103A of the pull-down transistor 100A may be greater compared to a transistor width 103B of the pass transistor 100B, in order to establish the different current capabilities of these transistors.

Figure 1C:
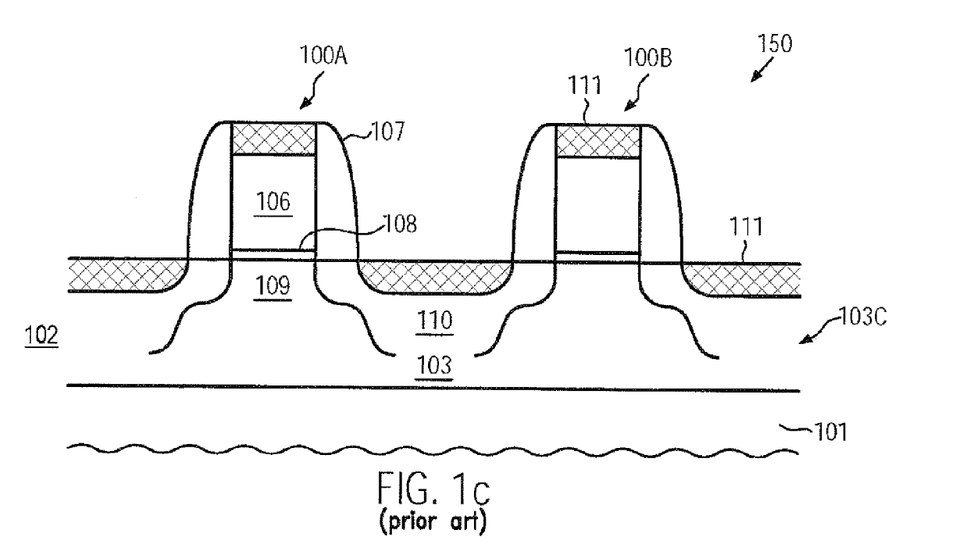
FIG. 1c schematically illustrates a cross-sectional view of the transistors shown in FIG. 1b according to conventional techniques.

FIG. 1c schematically illustrates a cross-sectional view taken along the line 1c of FIG. 1b. As illustrated, the device 150 comprises a substrate 101 which may typically be provided in the form of a silicon substrate, possibly in combination with a buried insulating layer (not shown) if an SOI (silicon on insulator) is considered. Above the substrate 101 and a possible buried insulating layer the semiconductor layer 103c in the form of a silicon layer is provided, in which the isolation structure 102 may be formed according to the desired shape so as to define the active region 103 according to the configuration as shown in FIG. 1b. That is, the active region 103 has the width 103a in the transistor 100a and has the width 103b in the transistor 100b. In this respect, an active semiconductor region is to be understood as a semiconductor region having an appropriate dopant concentration and profile so as to form one or more transistor elements in and above the active region, which have the same conductivity type. For example, the active region 103 may be provided in the form of a lightly p-doped semiconductor material, for instance in the form of a p-well, when the semiconductor layer 103c may extend down to a depth that is significantly greater than the depth dimension of the transistors 100a, 100b, when the transistors 100a, 100b may represent n-channel transistors. Similarly, the active region 103 may represent a basically n-doped region when the transistors 100a, 100b represent p-channel transistors. Furthermore, in the manufacturing stage shown in FIG. 1c, the transistors 100a, 100b may comprise the gate electrode 106, for instance in the form of a polysilicon material, which is separated from a channel region 109 by a gate insulation layer 108. Furthermore, depending on the overall process strategy, a sidewall spacer structure 107 may be formed on sidewalls of the gate electrodes 106. Additionally, drain and source regions 110 may be formed in the active region 103 and may connect the transistors 100a, 100b. Typically, metal silicide regions 111 are provided in the gate electrode 106 and an upper portion of the drain and source regions 110, so as to reduce contact resistance of these areas.

FIG. 1c schematically illustrates a cross-sectional view taken along the line 1c of FIG. 1b. As illustrated, the device 150 comprises a substrate 101 which may typically be provided in the form of a silicon substrate, possibly in combination with a buried insulating layer (not shown) if a silicon-on-insulator (SOI) is considered. Above the substrate 101 and a possible buried insulating layer, the semiconductor layer 103C, in the form of a silicon layer, is provided, in which the isolation structure 102 may be formed according to the desired shape to define the active region 103 according to the configuration as shown in FIG. 1b. That is, the active region 103 has the width 103A in the transistor 100A and has the width 103B in the transistor 100B. In this respect, an active semiconductor region is to be understood as a semiconductor region having an appropriate dopant concentration and profile so as to form one or more transistor elements in and above the active region, which have the same conductivity type. For example, the active region 103 may be provided in the form of a lightly P-doped semiconductor material, for instance in the form of a P-well, when the semiconductor layer 103C may extend down to a depth that is significantly greater than the depth dimension of the transistors 100A, 100B, when the transistors 100A, 100B may represent N-channel transistors. Similarly, the active region 103 may represent a basically N-doped region when the transistors 100A, 100B represent P-channel transistors. Furthermore, in the manufacturing stage shown in FIG. 1c, the transistors 10A, 100B may comprise the gate electrode 106, for instance in the form of a polysilicon material, which is separated from a channel region 109 by a gate insulation layer 108. Furthermore, depending on the overall process strategy, a sidewall spacer structure 107 may be formed on sidewalls of the gate electrodes 106. Additionally, drain and source regions 110 may be formed in the active region 103 and may connect the transistors 100A, 100B. Typically, metal silicide regions 111 are provided in the gate electrode 106 and an upper portion of the drain and source regions 110 to reduce contact resistance of these areas.

The device 150 is typically formed on the basis of the following processes. First, the isolation structure 102 may be formed, for instance as a shallow trench isolation, by etching respective openings into the semiconductor layer 103C down to a specific depth, which may even extend to a buried insulating layer, if provided. Thereafter, the corresponding openings may be filled with an insulating material by deposition and oxidation processes, followed by a planarization such as chemical mechanical polishing (CMP) and the like. During the process sequence for the isolation structure 102, advanced lithography techniques may have to be used in order to form a corresponding etch mask, which substantially corresponds to the shape of the active region 103, which requires the definition of a moderately narrow trench to obtain the desired reduced width 103B of the transistor 100B. Thereafter, the basic doping in the active region 103 may be provided by performing respective implantation sequences, which may also include sophisticated implantation techniques for introducing dopants for defining the channel doping and the like. Next, the gate insulation layers 108 and the gate electrodes 106 may be formed by depositing, oxidizing and the like an appropriate material for the gate insulation layer 106, followed by the deposition of an appropriate gate electrode material, such as polysilicon. Subsequently, the material layers are patterned by using advanced lithography and etch techniques, during which the actual length 106L of the gate electrodes 106 may be adjusted, thereby requiring extremely advanced process techniques to obtain a gate length of approximately 50 nm and less. Next, a part of the drain and source regions 110 may be formed by implanting appropriate dopant species, followed by the formation of the spacer structure 107, or at least a portion thereof, followed by a subsequent implantation process for defining the deep drain and source areas, wherein a corresponding implantation sequence may be repeated on the basis of an additional spacer structure if sophisticated lateral concentration profiles may be required in the drain and source regions 110. Thereafter, appropriate anneal processes may be performed to re-crystallize implantation-induced damage in the active region 103 and also to activate the dopant species in the drain and source areas 110.

It should be appreciated that, for a reduced gate length in the above-defined range, the sophisticated geometric configuration of the active region 103 may result in process non-uniformities, for instance during the deposition and etching of a spacer material for forming the sidewall spacer 107. Typically, the spacer structure 107 is formed by depositing an appropriate material, for instance a silicon dioxide liner (not shown) followed by a silicon nitride material, which may be subsequently selectively etched with respect to the silicon dioxide liner on the basis of well-established anisotropic etch recipes. However, at areas indicated as 112 in FIG. 1b, irregularities may be observed which may even be increased due to respective non-uniformities created during previously performed lithography processes, such as the lithography process for patterning the gate electrodes 106 and the like. Consequently, the areas 112 may have a significant influence on the further processing of the device 150, which may finally result in a non-predictable behavior of the transistor 100B and thus the overall memory cell 150.

One prominent failure mechanism is associated with shorts caused by nickel silicide leakage paths. That is, during the further processing, the metal silicide regions 111 may be formed by depositing a refractory metal, such as nickel, which may then be treated to react with the underlying silicon material, wherein, typically, the isolation structure 102 and the spacer structure 107 may substantially suppress the creation of a highly conductive metal silicide. However, due to the previously generated irregularities, respective leakage paths or even short circuits may be created, which are believed to be caused by corresponding diffusion paths created by the previously generated irregularities. Thus, nickel may migrate along the diffusion paths and may form an electrical connection between per se isolated areas, such as the gate electrode 106 and the active region 103, thereby undesirably influencing the final drive current capability of the transistor 100B, which may result in a less stable and less reliable operation of the memory cell 150, or even cause a complete failure of the memory cell 150, thereby significantly contributing to yield loss of sophisticated semiconductor devices including static RAM areas.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which the drive current capability of transistor elements may be adjusted on the basis of sophisticated "gate engineering" techniques, in which at least one drive current influencing characteristic, such as the gate dielectric thickness, the gate length and the like, may be varied along the transistor width direction, thereby enabling a simplified overall geometry of the active regions, which, in some illustrative embodiments, may be provided in a substantially rectangular configuration so that a substantially identical physical transistor width may be obtained for the various transistor elements while nevertheless providing a desired difference in current drive capability. In some illustrative aspects disclosed herein, the adjustment of the drive current may be provided for transistor elements of a memory cell, thereby obtaining a desired ratio of drive currents between the different transistor elements, while at the same time avoiding or at least reducing any process-induced irregularities that may conventionally be associated with the geometry of active regions in memory cells, when the ratio of drive currents may be established on the basis of a different physical width of one or more active regions in the memory cell. Due to the significantly simplified overall geometry of the active regions in the memory cell, in particular significantly improved conditions during a metal silicide processing sequence may be obtained, thereby reducing the risk of creating increased leakage paths or short circuits by advanced metal silicides, such as nickel silicide. Consequently, an efficient adjustment of the drive current capability of transistors, for instance of a pull-down transistor and a pass transistor of a static RAM cell, may be obtained in the same active region, which may have a substantially constant width, whereas respective techniques for modifying the gate electrode structures may be implemented into the conventional process flow substantially without adding undue process complexity.

One illustrative method disclosed herein comprises forming a first gate electrode structure of a first transistor of a memory cell above a first active region of a semiconductor device, wherein the first transistor has a first conductivity type and a first transistor width. The method further comprises adjusting a drive current capability of the first transistor by varying at least one of a gate dielectric thickness and a gate length along the first transistor width.

A further illustrative method disclosed herein comprises forming a first transistor of a memory cell, wherein the first transistor has a first gate electrode structure. Furthermore, a second transistor of the memory cell is formed, wherein the second transistor has a second gate electrode structure. Finally, the method comprises adjusting a ratio of drive current capability of the first and second transistors by varying a gate dielectric thickness along a transistor width direction of at least one of the first and second gate electrode structures.

One illustrative semiconductor device disclosed herein comprises a first transistor comprising a first gate electrode structure, wherein the first transistor has a first transistor width. The semiconductor device further comprises a second transistor comprising a second gate electrode structure, wherein the second transistor has the first transistor width. Moreover, at least one of a gate dielectric thickness and a gate length of at least one of the first and second gate electrode structures varies along a transistor width direction.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides methods and semiconductor devices in which the drive current capability of transistor elements formed in the same or different active regions may be selectively adjusted by manipulating transistor characteristics, such as gate dielectric thickness, gate length and the like for an individual transistor element in order to obtain an appropriate effective transistor width. That is, one or more performance relevant components may be locally modified to obtain a desired effective transistor width in order to provide, in combination with other transistors, the overall operational behavior as required by the circuit requirements. In some illustrative aspects, this mechanism for locally adjusting certain transistor characteristics, which may also be referred to as local gate engineering, may be efficiently applied to memory cells, such as static RAM cells, in which, conventionally, the required difference in drive current capability of the various transistors may be established by lithographically patterning active regions with different physical widths, which, however, may result in significant yield loss, in particular if highly scaled transistor elements having a general gate length of less than 50 nm may be observed. As previously discussed, in particular, a pronounced probability for creating leakage paths or short circuits during the silicidation process may be observed in conventional advanced memory areas in which drive current ratios may be adjusted by reducing the width of an active region, for instance for a pass transistor, which, however, may not be compatible with a further device scaling. Consequently, due to the principles disclosed herein, well-established and scalable process steps may be used for locally adjusting the characteristics of the gate electrode structures in order to obtain a desired ratio of drive currents without requiring sophisticated lithography patterning regimes for adjusting different widths of active regions in the memory cell. For example, areas of increased gate dielectric thickness may be defined within a transistor area along the transistor width direction, substantially without affecting other processes, thereby providing an efficient mechanism for reducing the effective transistor width. In other illustrative embodiments, a gate length may be varied, that is, an increased gate length may be provided along a certain distance in the transistor width direction, thereby also reducing the effective transistor width, which may also be accomplished without significant influence on other process steps, since a corresponding gate length variation may be readily established on the basis of a modified lithography mask. In still other illustrative embodiments, the above-described mechanisms for reducing the effective transistor width may be combined, thereby even further enhancing the overall efficiency of these mechanisms. That is, an increased gate dielectric thickness may be associated with an increased gate length, thereby obtaining an increased range for adjusting the effective transistor width, while nevertheless maintaining a high degree of compatibility with conventional process techniques.

It should be appreciated that the principles disclosed herein may be advantageously applied to semiconductor devices including transistor elements having a nominal gate length of approximately 50 nm and less, since, in these cases, pronounced yield losses may be observed for transistor elements formed in densely packed device regions, possibly in a common active region having a varying width dimension, as is typically the case in conventional RAM areas. The present disclosure may, however, also be applied to any device architectures, irrespective of the corresponding critical dimensions, when an efficient mechanism for adjusting drive current ratios is required and hence the present disclosure should not be construed as being restricted to specific transistor dimensions unless such restrictions are specifically set forth in the appended claims or the embodiments described in the specification.

With reference to FIGS. 2a-2h, illustrative embodiments will now be described in more detail, wherein reference may also be made to FIGS. 1a-1c when appropriate.

Figure 2A:
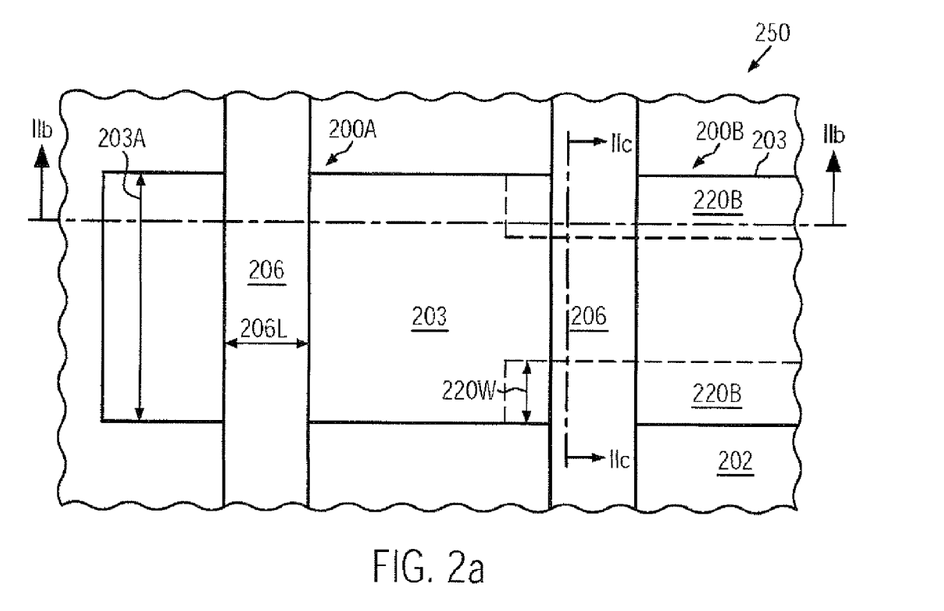
FIG. 2a schematically illustrates a top view of a portion of an active region in and above which transistors of the same conductivity type may be formed so as to have a different drive current capability on the basis of substantially the same physical transistor width by using in at least one of the transistors a varying gate dielectric thickness, according to illustrative embodiments.

FIG. 2a schematically illustrates a top view of a semiconductor device 250 which, in one illustrative embodiment, may represent a portion of an integrated circuit in which, at least in some device areas, transistor elements of the same conductivity type are to be formed in and above a single active semiconductor region. As will be described later on in more detail, in other device regions, transistor elements requiring a specified ratio of the drive current capabilities may be formed in and above different active regions, for instance when a different conductivity type may be required for the individual transistor elements. In one embodiment, the semiconductor device 250 may represent a portion of a static RAM cell having an electrical configuration as is explained with reference to FIG. 1a. The semiconductor device 250 may comprise a substrate (not shown in FIG. 2a) above which may be formed a semiconductor layer (not shown) in which an isolation structure 202 may be provided that may be comprised of any appropriate insulating material, such as silicon dioxide, silicon nitride and the like. The isolation structure 202 may define an active semiconductor region 203. As previously explained, an active region is to be understood as a continuous semiconductor region without intermediate isolation structures, wherein, in the embodiment shown, two or more transistor elements of the same conductivity type may be formed in and above the active region 203. As shown, the active region 203 may comprise components of a first transistor 200A and a second transistor 200B, which may represent transistors of the same conductivity type, such as N-channel transistors or P-channel transistors, which may, however, require a different drive current capability, as is required by the overall configuration of the device 250. In one illustrative embodiment, the first transistor 200A may represent a pull down transistor of a static RAM cell, while the second transistor 200B may represent a pass transistor that is connected to the pull down transistor 200A via the common active region 203. In another illustrative embodiment, the active region 203 may have a width dimension 203A that is substantially constant and thus may define a substantially identical "physical" width for the first transistor 200A and the second transistor 200B. That is, in the embodiment shown in FIG. 2a, the width 203A may, except for any process variations, be the same for the first and second transistors 200A, 200B. In other cases, the width 203A may be different for the transistors 200A, 200B, however with a less pronounced degree, as is for instance illustrated in FIG. 1b of a conventional static RAM cell in which a pronounced difference in the drive current capability may be required. According to the principles disclosed herein, a respective variation of the transistor width 203A, if desired, may be provided with a less pronounced degree since a difference in drive current capability between the transistors 200A, 200B may be obtained by applying local gate engineering, at least for one of the transistors 200A, 200B, thereby efficiently adjusting the effective transistor width, as also described above.

In the illustrative embodiment shown in FIG. 2a, the active region 203 accommodating the first and second transistors 200A, 200B may have a substantially rectangular configuration, thereby providing very efficient process conditions during lithography processes, etch processes and the like so that enhanced overall process uniformity may be accomplished, thereby reducing yield losses even if semiconductor devices of critical dimensions of approximately 50 nm and less may be considered.

In the embodiment shown, the transistors 200A, 200B may comprise a gate electrode 206 having, in some illustrative embodiments, a length 206L of 50 nm or less, wherein, for instance, the lengths 206L may be substantially identical except for process variations for the transistors 200A, 200B. In other illustrative embodiments, the gate length 206L of at least one of the transistors 200A, 200B may vary along the transistor width direction, i.e., the width direction 203A, so as to adjust the effective transistor width or drive current capability, as will be explained later on in more detail. Furthermore, depending on the manufacturing stage, the transistor 200B may comprise areas of increased gate dielectric thickness 220B. For example, as shown in FIG. 2a, two areas 220B of increased gate dielectric thickness may be provided adjacent to the isolation regions 202 at the corresponding ends of the transistor 200B so that, in the vicinity of the portions 220B, a reduced transistor performance with respect to drive current may be obtained, thereby also affecting the overall drive current capability of the transistor 200B. Consequently, by selecting the size and the number of portions 220B with increased gate dielectric thickness, the overall drive current of the transistor 200B and thus the effective "transistor width" may be adjusted, while nevertheless the physical transistor width may be defined by the width 203A of the active region 203. On the other hand, the provision of a locally increased gate dielectric thickness in the transistor 200B may not substantially negatively affect any other device characteristics and process techniques, thereby substantially avoiding any negative effects, while nevertheless providing enhanced process uniformity with respect to irregularities that may be caused by a sophisticated geometry of active regions, as may be the case in conventional static RAM areas.

Figure 2B:
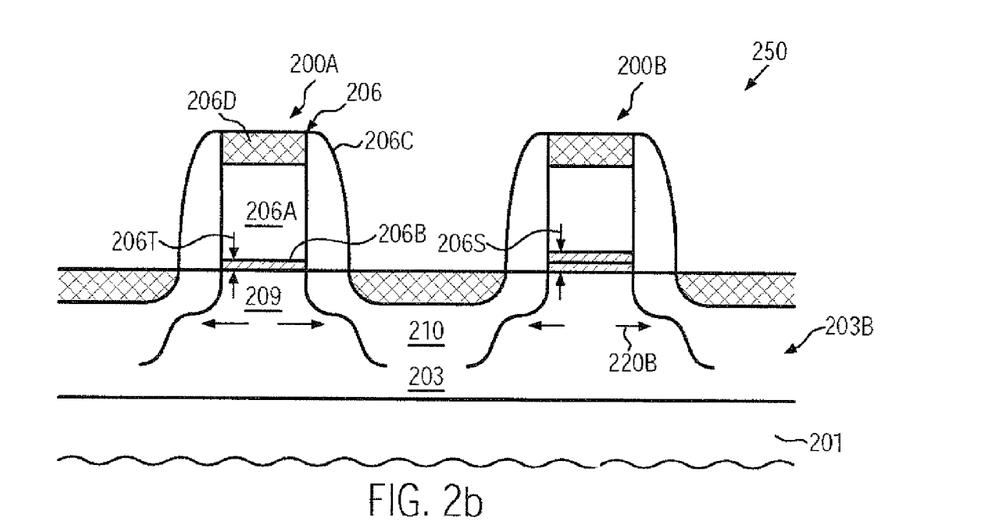
FIG. 2b schematically illustrates a cross-sectional view of the transistors of FIG. 2a, in which at least one of the transistors may have a varying gate dielectric thickness so as to adjust the ratio of the drive current capabilities, according to illustrative embodiments.

FIG. 2b schematically illustrates a cross-sectional view of the device 250 along the line IIb of FIG. 2a. As illustrated, the device 250 may be illustrated in an advanced manufacturing stage in which it may comprise a substrate 201, above which may be formed a semiconductor layer 203B, in which is defined the active region 203 by means of the isolation structure 202 (not shown in FIG. 2b). The substrate 201, in combination with the semiconductor layer 203B, may define a bulk configuration, i.e., the semiconductor layer 203B may represent an upper portion of a crystalline semiconductor material of the substrate 201, or in other cases the substrate 201 and the semiconductor layer 203B may define an SOI configuration when a buried insulating layer (not shown) may be provided between the substrate 201 and the semiconductor layer 203B. It should be appreciated that a bulk configuration and an SOI configuration may be commonly provided in the device 250 in different device areas, if considered appropriate. For example, device areas including speed-critical signal paths may be provided as an SOI configuration, while other areas may be provided in the form of a bulk configuration, for instance in view of enhanced overall threshold stability and the like. In the manufacturing stage shown, the transistors 200A, 200B may comprise the gate electrode structures 206, which may locally vary in at least some components in one or both the of the transistors 200A, 200B. In this manufacturing stage, the gate electrode structures 206 may comprise a gate electrode 206A, such as doped polysilicon material and the like, which may be formed on a gate insulation layer 206B, which separates the gate electrode 206A from a channel region 209. Furthermore, the gate electrode structures 206 may comprise a metal silicide region 206D, such as a nickel silicide and the like, depending on the overall process and device requirements. Furthermore, a spacer structure 206C may be formed on the sidewalls of the gate electrode structures 206. Again referring to FIG. 2a, in the embodiment shown, the first transistor 200A may have a substantially constant gate dielectric thickness, indicated as 206T, which may be selected in accordance with overall device requirements so as to obtain the required transistor behavior for the device 200A. For example, if a moderately high drive current capability may be required for the transistor 200A, the thickness 206T may range from 1-2 nm for silicon dioxide based gate dielectric materials. On the other hand, a gate dielectric thickness 206S of the gate electrode structure 206 of the transistor 200B may have an increased value within the portions 220B in order to reduce transistor performance in these portions, thereby also effectively reducing the overall drive current capability of the transistor 200B. That is, due to the reduced capacitive coupling caused by the increased thickness 206S within the portions 220B, a specified control voltage applied to the gate electrode 206A of the transistor 200B may result in a reduced conductivity. For example, the increased gate dielectric thickness 206S may range from approximately 1.5 to several nanometers, depending on the overall process requirements. That is, the increased dielectric thickness 206S may be established in combination with an increased gate dielectric thickness at other device areas and may therefore depend on the device characteristics of transistor elements in other device areas. In other illustrative embodiments, the gate dielectric thickness 206S may be specifically selected for the portions 220B, thereby providing enhanced efficiency in adjusting the overall drive current of the transistor 200B. In this case, the thickness 206S may be selected independently from other device areas, which may be accomplished on the basis of an additional lithography process. Furthermore, if the increased thickness value 206S may be predefined, for instance due to process-specific criteria, as explained above, the drive current may be adjusted, in addition to the increased thickness 206S, by the size of the portions 220B with respect to the overall transistor width 203A. That is, by adjusting a width 220W of one or more of the portions 220B, the fraction of the entire transistor width 203A of the device 200B may be selected, which may contribute with a significantly reduced amount to the overall drive current capability of the device 200B. Consequently, an efficient mechanism for adjusting the drive current capability of the transistor 200B may be accomplished by the parameters 206S and 220W.

It should be appreciated that a corresponding mechanism may also be applied in the transistor 200A, when more than two different transistor types of different drive current capability may have to be provided in the device 250. For example, transistor elements may be formed in accordance with the design rules to obtain a maximum current drive capability, thereby requiring a minimal gate length and a minimal thickness of the gate dielectric material 206B. Based on this maximum performance transistor, a graded drive current capability for other transistors, such as the transistors 200A, 200B, may be accomplished by applying the above-specified mechanism to obtain, for instance, an appropriately reduced drive current for the transistor 200A, for instance by selecting one or more portions 220B of reduced width 220W and providing the transistor 200B as shown in FIGS. 2a and 2b so as to provide a further reduced drive current capability grade in this device. It should be appreciated that in combination with or alternatively to varying the gate dielectric thickness in the gate electrode structures 206, the gate length may also be varied, as will be described later on in more detail.

The semiconductor device 250 as shown in FIGS. 2a and 2b may be formed on the basis of process techniques as previously described with reference to the device 150, wherein, as indicated above, the simplified geometry of the active region 203 may provide relaxed conditions during the entire manufacturing flow. Furthermore, during the sequence for forming the gate electrode structures 206, the portions 220B may be defined by lithography and oxidation and/or deposition techniques, possibly in combination with sophisticated implantation processes, in order to provide a different gate dielectric thickness in the portions 220B. For example, prior to actually forming the gate dielectric material, an implantation process may be performed on the basis of a lithography mask, which may expose the portions 220B and possibly other device areas in which an increased thickness of a gate dielectric material is desired. The implantation process may result in heavy damage of a surface portion of the exposed active region 203, thereby providing a different diffusion behavior in a subsequent oxidation process for forming the gate insulation layers 206B. Consequently, in the damaged portions 220B, an increased oxide growth may be accomplished, thereby providing the desired locally increased thickness 206S. Thereafter, the further processing may be continued, as described above, however, on the basis of less pronounced irregularities due to the simplified geometry of the active region 203. That is, after forming the gate electrode structures 206 and drain and source regions 210 on the basis of process techniques as previously described, the metal silicide regions 206D, for instance in the form of nickel silicide, may be formed while the reduced degree of process-induced irregularities may significantly reduce the probability of creating leakage paths and short circuits so that enhanced production yield may be obtained for critical device areas, such as static RAM areas.

Figure 2C:
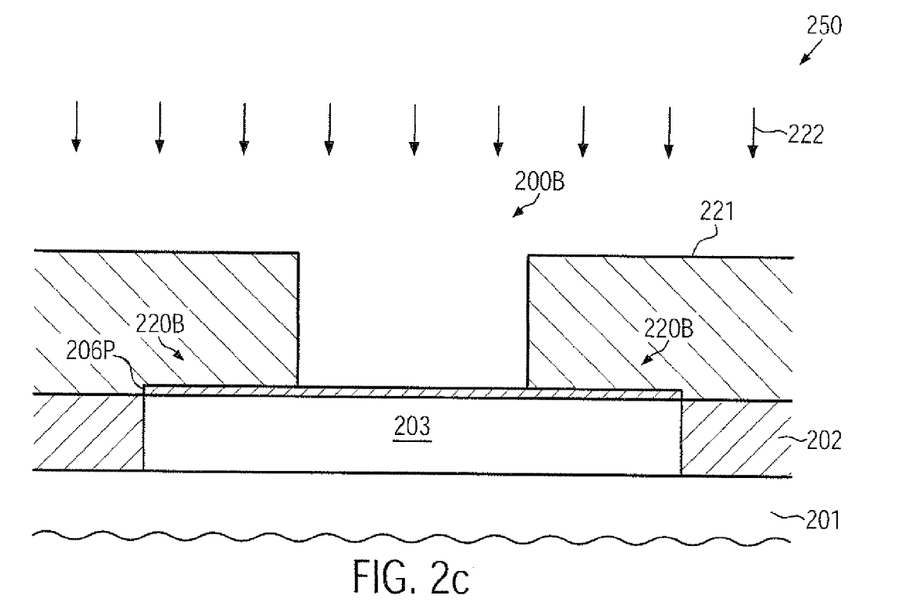
FIGS. 2c-2e schematically illustrate cross-sectional views along a transistor width direction during various manufacturing stages in forming a gate dielectric material having a varying thickness along the transistor width direction, according to illustrative embodiments.
Figure 2D:
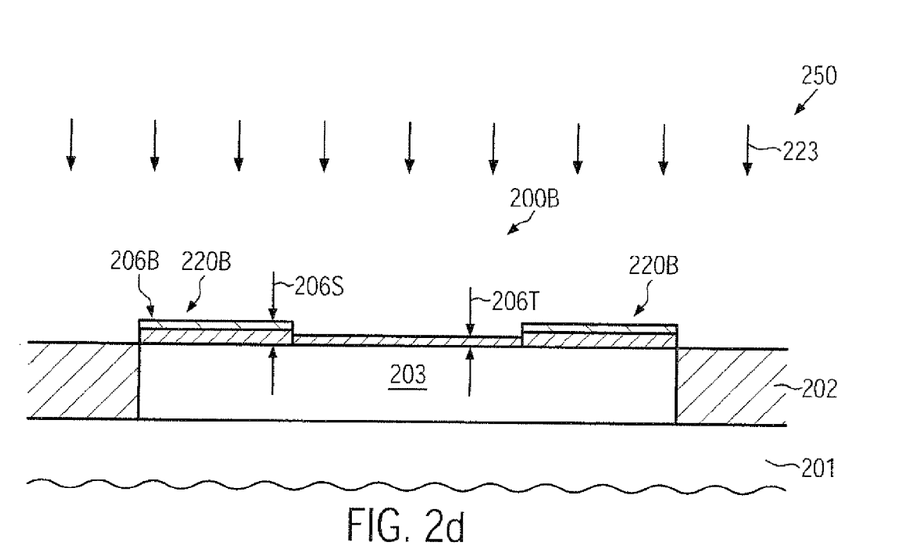
Figure 2E:
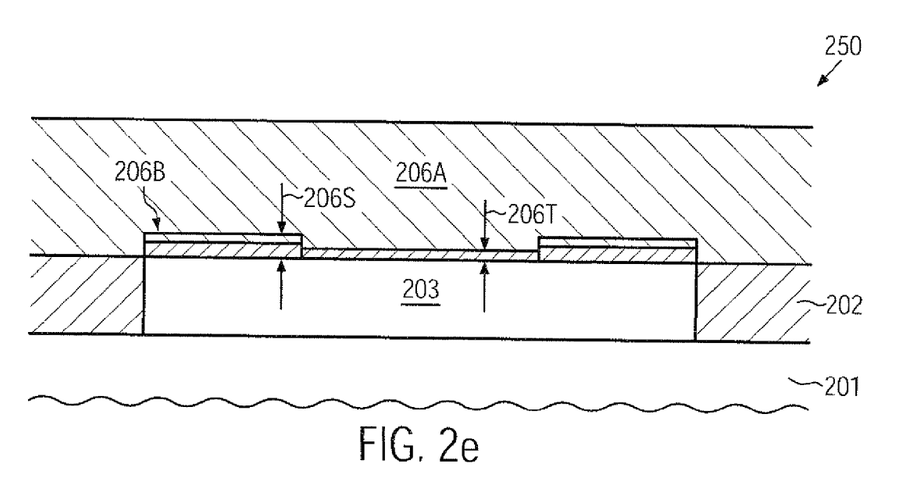

With reference to FIGS. 2c-2e, further illustrative embodiments will now be described in which the gate dielectric material 206B may be formed so as to have locally the increased thickness 206S.

FIG. 2c schematically illustrates the semiconductor device 250 in a cross-sectional view taken along the transistor width direction 203A, i.e., along the line IIc of FIG. 2a. In the manufacturing stage shown, a dielectric base material 206P may be formed on the active region 203, for instance by oxidation, while, in other cases, the layer 206P may be formed by deposition so that, in this case, the layer 206P may also cover the isolation structure 202. The base material 206P may act as a first portion of the gate dielectric material in the areas 220B, in which the increased thickness 206S is to be provided. Furthermore, an etch mask 221, such as a resist mask, may be formed to cover the portions 220B while exposing the remaining transistor area of the transistor 200B (see FIG. 2a). The dielectric base material 206P may be formed on the basis of any appropriate process technique, as is established in the art, for instance by oxidation, surface treatment, deposition or a combination thereof. Thereafter, the mask 221 may be formed on the basis of lithography techniques, wherein alignment accuracy may be less critical, since any placement error with respect to the transistor length direction, i.e., in FIG. 2c, the direction perpendicular to the drawing plane, may not affect the further processing, while a placement error along the transistor width direction, i.e., in FIG. 2c, the horizontal direction, may actually not affect the desired effective transistor width, since, for instance, reducing one of the portions 220B along the transistor width direction may correspondingly increase the width of the other portion 220B. It should further be appreciated that the mask 221 may also provide an increased gate dielectric thickness in other device areas, if required. Thereafter, the device 250 may be exposed to an etch ambient 222 designed to selectively remove the material of the base layer 206P, for which a plurality of well-established etch recipes are available. For example, silicon dioxide based materials may be removed by well-established wet chemical etch recipes, such as hydrofluoric acid (HF) and the like. Thereafter, the mask 221 may be removed and appropriate cleaning processes may be performed to prepare the exposed surface portions for a further process step for forming the gate dielectric materials 206B.

FIG. 2d schematically illustrates the semiconductor device 250 after completing the above-described process sequence. Furthermore, the device 250 may be exposed to an ambient 223 for forming a gate dielectric material, for instance by oxidation, deposition, surface treatment and the like. For instance, the ambient 223 may represent an oxidizing ambient designed to grow the gate dielectric material 206B in the previously exposed portion and also thicken the base material 206P (see FIG. 2c) according to the portion 220B. Consequently, after completing the process 223, the gate dielectric material 206B may be provided so as to have the increased thickness 206S in the portions 220B and the "nominal" thickness 206T in the central region of the transistor 200B and also in the transistor 200A (not shown).

FIG. 2e schematically illustrates the semiconductor device 250 after the deposition and patterning of a gate electrode material, thereby providing the gate electrode 206A. The deposition of an appropriate gate electrode material and the patterning of the same may be accomplished on the basis of process techniques as are also previously described with reference to the device 150. Consequently, a high degree of compatibility may be maintained during the process sequence for providing the locally varying thickness 206S, 206T in the transistor 200B, while nevertheless providing overall enhanced process uniformity with respect to forming the metal silicide regions 206D (see FIG. 2b) and the like.

Figure 2F:
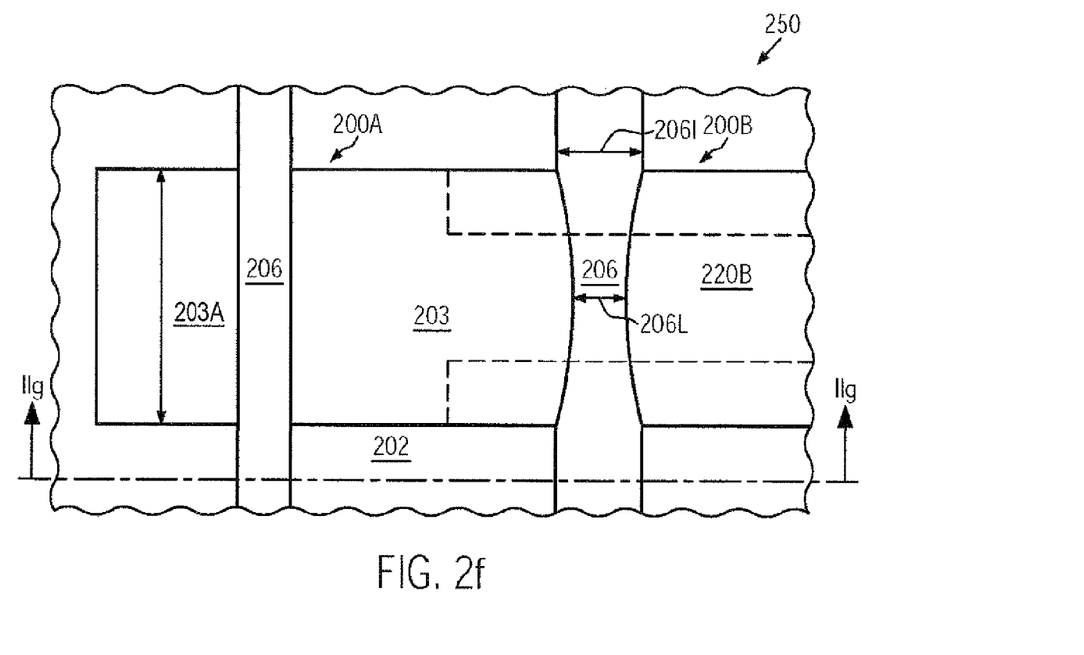
FIG. 2f schematically illustrates a top view of the semiconductor device in which at least a gate length is varied along a transistor width direction in one of the transistors, according to further illustrative embodiments.
Figure 2G:
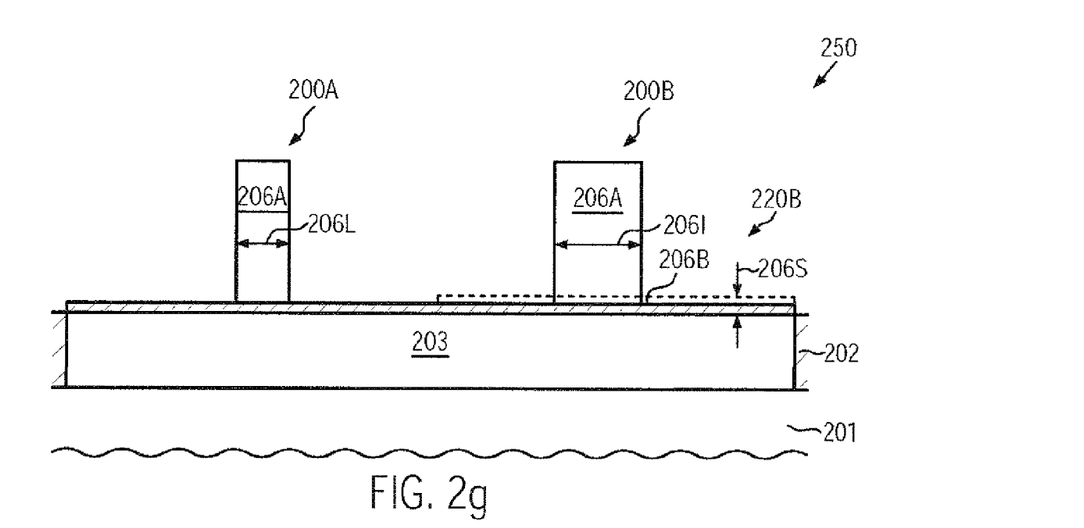
FIG. 2g schematically illustrates a cross-sectional view along the transistor length direction at a portion in which an increased gate length may be provided in one of the transistors, possibly in combination with an increased gate dielectric thickness, according to yet other illustrative embodiments.

With reference to FIGS. 2f-2g, further illustrative embodiments will now be described in which, in addition to or alternatively to varying the gate dielectric thickness of one or more transistors, a gate length may be varied in order to adjust the effective transistor width and, thus, drive current capability.

FIG. 2f schematically illustrates a top view of the device 250 in a manufacturing stage in which the gate electrode structures 206 may be formed to a certain degree. That is, at least the gate electrode materials 206A in combination with the gate insulation layers 206B (see FIG. 2g) may be provided. In the embodiment shown, the gate length 206L may vary in the transistor 200B along the transistor width direction 203A, while the transistor 200A may have a substantially constant gate length 206L, except for any process-induced variations. It should be appreciated that, as previously discussed, the gate length 206L in the first transistor 200A may also vary if a respective increase of the effective transistor width of the transistor 200A may be required. In the embodiment shown, the transistor 200B may have an increased gate length 206I at areas which may substantially correspond to the portions 220B, wherein the increased gate length 206I may also vary within the portions 220B, depending on the process techniques used for creating the increased gate length 206I. On the other hand, between the portions 220B, the nominal gate length 206L may be provided. It should be appreciated, however, that any other configuration for locally increasing the gate length may be used, depending on the compatibility with other process techniques. For instance, an increased gate length may be provided in a central portion of a gate electrode structure 206, while edge portions may be formed on the basis of the nominal gate length 206L.

FIG. 2g schematically illustrates a cross-sectional view of the semiconductor device 250 according to the line IIg of FIG. 2f. As illustrated, the gate electrode material 206A may have the increased gate length 206I in the second transistor 200B, while the nominal length 206L may be provided in the first transistor 200A. The semiconductor device 250 as shown in FIG. 2g may be formed on the basis of the following processes. After defining the active region 203 on the basis of the isolation structure 202, as previously explained, the gate dielectric layer 206B may be formed, for instance, on the basis of well-established techniques and, if a corresponding variation in thickness may be required, similar process techniques may be used as, for instance, described with reference to FIGS. 2c-2e in order to provide the enhanced thickness 206S in the portions 220B, as indicated by the dashed line. In this case, the reduction in transistor performance caused by the increased thickness 206S may be efficiently combined by the increased gate length 206I. In other illustrative embodiments, the mechanism of drive current adaptation by using locally an increased thickness 206I may be provided without providing the gate dielectric material 206B having the locally increased thickness 206S. Hence, after forming the gate dielectric material 206B, a gate electrode material 206A may be deposited, for instance in the form of polysilicon and the like, and subsequently an etch mask may be formed by lithography, wherein an appropriately designed lithography mask may be provided in which the gate electrode 206A may be defined so as to have the local increased length 206I. For example, respective mask features may be formed by well-established mask techniques, for instance using optical proximity corrections and the like, to obtain the desired increase of gate length along a specified portion of the transistor width direction. For example, an average increase of up to thirty percent or even higher of the nominal gate length 206L may be provided within a well-defined portion extending along the transistor width direction, for instance corresponding to the portions 220B. It should be appreciated that a corresponding relationship between the average degree of gate length increase and the corresponding reduction of drive current may be established on the basis of test measurements. After performing corresponding lithography processes on the basis of the specifically designed lithography mask, the further processing may be continued on the basis of well-established process techniques in order to obtain the gate electrode structures 206 for the transistors 200B, 200A. Consequently, an efficient adjustment of the drive current may be obtained, while nevertheless providing a high degree of compatibility with existing process techniques. That is, except for the different lithography mask, substantially the same process techniques may be used without modification, while nevertheless providing the required adaptation of the drive current. In embodiments in which the increased average gate length 206I may be used in combination with the increased thickness 206S, the overall range for varying the effective transistor width, i.e., the drive current, may be increased for a given nominal gate length, such as the gate length 206L, and a nominal gate dielectric thickness, such as the thickness 206T, which may thus provide the possibility of appropriately adjusting the ratio of drive currents for transistors to be formed in and above the same active region or even for transistors provided on different active regions in accordance with the overall device requirements.

Figure 2H:
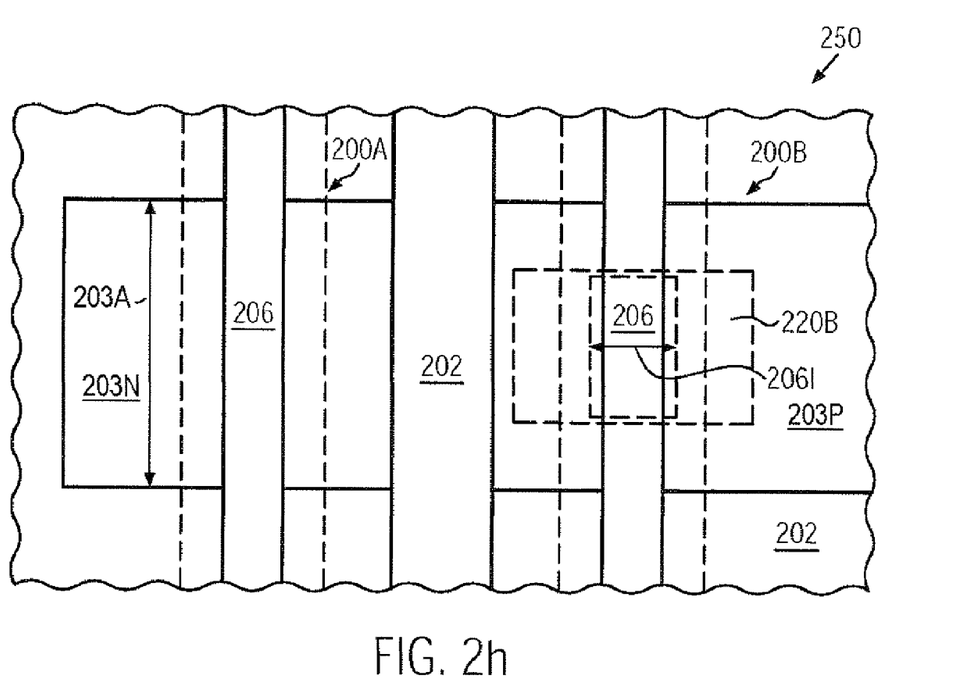
FIG. 2h schematically illustrates the semiconductor device according to still other illustrative embodiments in which the ratio of drive current capabilities between N-channel transistors and P-channel transistors may be adjusted on the basis of active regions of substantially identical width in accordance with principles described above.

FIG. 2h schematically illustrates a top view of the semiconductor device 250 according to further illustrative embodiments in which the transistors 200A, 200B may be formed in and above different active regions 203N, 203P, respectively, which in the embodiment shown may have substantially the same width 203A. For example, the active regions 203N, 203P may represent N-type active regions and P-type active regions, i.e., regions for forming therein N-channel transistors and P-channel transistors, respectively. Thus, the active regions 203N, 203P may be separated by a portion of the isolation structure 202. Furthermore, one or both of the transistors 200A, 200B may have a locally adapted gate electrode structure 206, for instance by providing an increased gate length and/or an increased gate dielectric thickness. For example, in the embodiment shown, the transistor 200B may require a reduced effective transistor width, i.e., a reduced drive current compared to a nominal drive current that would be obtained if the gate electrode structure 206 would be provided with the nominal characteristics. In this manner, the overall ratio between the drive currents of the transistors 200A, 200B may be adjusted. It should be appreciated that a corresponding mechanism may also be implemented in the transistor 200A if the range of drive current variation may not be appropriately adjustable by varying the local gate electrode characteristics of the transistor 200B only. As illustrated, one or more portions 220B may be provided in the transistor 200B having a desired size along the transistor width direction 203A to obtain the desired degree of current reduction. For example, within the portion 220B, which in the embodiment shown may be located at a central area with respect to the transistor width direction 203A, an increased gate dielectric thickness may be provided, as is for instance also previously described with reference to FIGS. 2a-2e. Furthermore, additionally or alternatively, the increased gate length 206I may be provided, as is also previously discussed.

With respect to any process techniques for forming the device 250 as shown in FIG. 2h, the same process techniques may be used as previously described. Thus, the different active regions 203N, 203P may be provided with substantially identical width dimensions, thereby contributing to an overall enhanced process uniformity, while nevertheless an efficient technique may be achieved to adapt the ratio of the drive current capabilities of the transistors 200A, 200B by locally adjusting the gate length and/or the gate dielectric thickness of one or both of the transistors 200A, 200B.

As a result, the present disclosure provides techniques and semiconductor devices in which the drive current capability may be adjusted by a local gate engineering technique in which the gate dielectric thickness and/or the gate length may be varied along the transistor width direction, substantially without affecting the overall manufacturing process flow. Consequently, a simplified geometric configuration may be used for the active regions since the adaptation of the drive currents may be accomplished on the basis of the local gate engineering, thereby providing enhanced process uniformity in preceding and subsequent process steps, for instance for forming metal silicide regions in densely packed device areas, such as static RAM cells, in which transistors formed on the same active region or in different active regions may have to be provided to exhibit a specified ratio of the drive current capabilities. For example, transistors formed on the same active regions may be provided on the basis of appropriate nominal device geometries and architectures with a simplified overall geometry of the active region, while the "effective transistor width" may be adjusted by varying the gate dielectric thickness and/or the gate length of at least one of the transistors to be formed in the common active region of simplified geometry. In other cases, a common width for active regions of different transistor types may be used while nevertheless an efficient adaptation of the current drive capabilities may be accomplished by using the local gate engineering technique. Consequently, complex integrated circuits including transistor elements having critical dimensions of 50 nm or less, such as 30 nm or less, which may comprise static RAM areas, may be formed with enhanced production yield due to increased overall process uniformity provided by the simplified geometry of the active regions, while nevertheless enabling an efficient adaptation of the effective transistor width.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first gate electrode structure of a first transistor above a first active region of a semiconductor device, said first transistor having a first conductivity type and a first transistor width; and
   adjusting a drive current capability of said first transistor by varying at least one of a gate dielectric thickness and a gate length along at least a portion of said first transistor width.

2. The method of claim 1, further comprising forming a second gate electrode structure of a second transistor of a memory cell above said first active region, wherein said first and second transistors have said first transistor width.

3. The method of claim 1, further comprising forming a second gate electrode structure of a second transistor of a memory cell above a second active region, wherein said first and second transistors have said first transistor width.

4. The method of claim 3, wherein said first and second active regions are formed so as to have a substantially constant width.

5. The method of claim 1, wherein varying at least one of a gate dielectric thickness and a gate length comprises forming a gate dielectric material of increased thickness to define at least one specified portion of said first active region and forming a part of said first gate electrode structure on said at least one specified portion.

6. The method of claim 5, wherein said gate dielectric material of increased thickness is formed to define two or more separated specified portions with an intermediate part of reduced thickness.

7. The method of claim 1, wherein varying at least one of a gate dielectric thickness and a gate length comprises patterning a gate electrode material to define at least one specified portion of said first active region having formed thereon a part of said first gate electrode structure with an increased gate length.

8. The method of claim 7, wherein said gate electrode material is patterned to define two or more portions with increased gate length with an intermediate part with reduced gate length.

9. The method of claim 7, wherein said part of said first gate electrode structure is formed so as to have an increased gate dielectric thickness.

10. The method of claim 1, further comprising forming said first active region so as to have a substantially constant width.

11. A method, comprising:
   forming a first transistor, said first transistor having a first gate electrode structure;
   forming a second transistor, said second transistor having a second gate electrode structure; and
   adjusting a ratio of drive current capability of said first and second transistors by varying a gate dielectric thickness along at least a portion of a transistor width direction of at least one of said first and second gate electrode structures.

12. The method of claim 11, wherein adjusting a ratio of drive current capability comprises varying the gate dielectric thickness of one of said first and second gate electrode structures while maintaining a gate dielectric thickness of the other one of said first and second gate electrode structures substantially constant along the transistor width direction.

13. The method of claim 11, wherein adjusting a ratio of drive current capability comprises varying the gate dielectric thickness of said first and second gate electrode structures.

14. The method of claim 11, wherein adjusting a ratio of drive current capability of said first and second transistors further comprises varying a gate length of at least one of said first and second gate electrode structures along a transistor width direction.

15. The method of claim 14, wherein a gate length of one of said first and second gate electrode structures is varied while maintaining a gate length of the other one of said first and second gate electrode structures substantially constant along the transistor width direction.

16. The method of claim 14, wherein a gate length of said first and second gate electrode structures is varied along the transistor width direction.

17. The method of claim 14, wherein a gate length of at least one of said first and second gate electrode structures is varied so as to provide an increased gate length at a part of said at least one of the first and second gate electrode structures that has an increased gate dielectric thickness.

18. The method of claim 11, wherein said first and second transistors are formed so as to have substantially the same width.

19. A semiconductor device, comprising:
   a first transistor comprising a first gate electrode structure, said first transistor having a first transistor width;
   a second transistor comprising a second gate electrode structure, said second transistor having said first transistor width,
   wherein at least one of a gate dielectric thickness and a gate length of at least one of said first and second gate electrode structures varies along at least a portion of a transistor width direction.

20. The semiconductor device of claim 19, wherein said first and second transistors are components of a memory cell.

21. The semiconductor device of claim 19, wherein said first and second transistors are formed in and above a common active region and wherein said common active region has a substantially constant width.

22. The semiconductor device of claim 19, wherein said first transistor is formed in and above a first active region and said second transistor is formed in and above a second active region, wherein said first and second active regions have substantially the same width.

23. The semiconductor device of claim 19, wherein said first gate electrode structure has a substantially constant gate dielectric thickness and a substantially constant gate length.

24. The semiconductor device of claim 19, wherein at least one of said first and second gate electrodes has a varying gate dielectric thickness and a substantially constant gate length along said transistor width direction.

25. The semiconductor device of claim 19, wherein at least one of said first and second gate electrodes has a varying gate length and a substantially constant gate dielectric thickness along said transistor width direction.

26. The semiconductor device of claim 19, wherein one of said first and second gate electrodes has a gate length and a gate dielectric thickness varying along said transistor width direction.

* * * * *